(12) United States Patent
Totani et al.

(10) Patent No.: US 7,240,426 B2
(45) Date of Patent: Jul. 10, 2007

(54) EQUIPMENT FOR BONDING PRINTED CIRCUIT BOARDS

(75) Inventors: Makoto Totani, Kariya (JP); Akinari Higashida, Anjo (JP)

(73) Assignees: DENSO CORPORATION, Kariya (JP); DENSO WAVE INCORPORATED, Tokyo (JP)

( * ) Notice: Subject to any disclaimer, the term of this patent is extended or adjusted under 35 U.S.C. 154(b) by 470 days.

(21) Appl. No.: 10/829,255

(22) Filed: Apr. 22, 2004

(65) Prior Publication Data

US 2004/0211057 A1    Oct. 28, 2004

(30) Foreign Application Priority Data

Apr. 28, 2003    (JP)    ............... 2003-124271

(51) Int. Cl.
*H05K 3/34* (2006.01)
(52) U.S. Cl. ............... 29/840; 29/830; 29/832; 29/842; 29/843
(58) Field of Classification Search ............... 29/830, 29/832, 840, 842, 843
See application file for complete search history.

(56) References Cited

U.S. PATENT DOCUMENTS

| 6,449,836 B1 | 9/2002 | Miyake et al. |
| 6,784,375 B2 | 8/2004 | Miyake et al. |
| 7,080,445 B2 * | 7/2006 | Miyake et al. ............... 29/830 |
| 2003/0079341 A1 | 5/2003 | Miyake et al. |

FOREIGN PATENT DOCUMENTS

| JP | A-10-270820 | 10/1998 |
| JP | A-2000-021930 | 1/2000 |

* cited by examiner

*Primary Examiner*—Richard Chang
(74) *Attorney, Agent, or Firm*—Posz Law Group, PLC

(57) ABSTRACT

Equipment for bonding a flexible printed circuit board made of thermoplastic resin on a printed circuit board includes a heater and a jig. The heater head presses and heats the flexible printed circuit board. The jig prevents the thermoplastic resin from flowing out when the flexible printed circuit is bonded on the printed circuit board. The jig is to be disposed between the flexible printed circuit board and the heater head. The jig includes a thin plate having a base plate and a wing plate. The base plate is parallel to a top surface of the heater head to be sandwiched between the flexible printed circuit board and the heater head. The wing plate is disposed on both sides of the base plate to bend from the base plate.

6 Claims, 7 Drawing Sheets

EQUIPMENT FOR BONDING PRINTED CIRCUIT BOARDS

CROSS REFERENCE TO RELATED APPLICATION

This application is based on Japanese Patent Application No. 2003-124271 filed on Apr. 28, 2003, the disclosure of which is incorporated herein by reference.

FIELD OF THE INVENTION

The present invention relates to equipment and a method for bonding printed circuit boards.

BACKGROUND OF THE INVENTION

There is a method for connecting (i.e., bonding) a printed circuit board to a flexible printed circuit board. Specifically, a lead terminal (i.e., a land) of the printed circuit board is soldered to a lead terminal (i.e., a land) of the flexible printed circuit board. The lead terminal of the printed circuit board faces the lead terminal of the flexible printed circuit board. Then, flexible printed circuit board is pressed and heated from the upper side of the flexible printed circuit board by a heating tool (i.e., a heater head) of hot press equipment. Thus, solders on the lead terminals of both the circuit boards melt so that they are bonded together.

After soldering between the lead terminals, a clearance is formed between the printed circuit board and the flexible printed circuit board. Therefore, it is required that the clearance is sealed and filled with resin. The resin also works as reinforcement of a connection between the circuit boards and water protect of the lead terminals.

However, in the above method, it is necessitated to add an additional process for sealing and filling the clearance between the circuit boards with the resin after the terminals are bonded and soldered. Therefore, the number of manufacturing processes in the method is increased, so that a manufacturing cost is increased.

In view of the above problem, another method for connecting a printed circuit board to a flexible printed circuit board is disclosed in Japanese Unexamined Patent Application Publication No. H10-270820. In this method, the flexible printed circuit board is made of thermoplastic resin so that the flexible printed circuit board is melted by heat in case of soldering. Thus, the clearance between the flexible printed circuit board and the printed circuit board is filled with resin composing the flexible printed circuit board.

This method can be performed without sealing the clearance with resin. Specifically, an additional process for sealing and filling the clearance with resin is not necessitated in the method of the prior art. However, when the heater head presses and heats the flexible printed circuit board so that the resin of the flexible printed circuit board is melted, the melted resin is flown out so that the thickness of the flexible printed circuit board is partially thinned. In this case, stress is concentrated at a portion where the thickness becomes thin, so that the circuit boards bonded together have weak mechanical strength.

SUMMARY OF THE INVENTION

In view of the above-mentioned problems, it is an object of the present invention to provide equipment for bonding printed circuit boards. It is another object of the present invention to provide a method for bonding printed circuit boards.

Equipment for soldering and bonding a flexible printed circuit board on a printed circuit board includes a heater and a jig. The flexible printed circuit board is made of thermoplastic resin. The heater head presses and heats the flexible printed circuit board on the printed circuit board. The jig prevents the thermoplastic resin composing the flexible printed circuit board from flowing out in a case where the flexible printed circuit is heated by the heater head. The jig and the heater head have a predetermined positional relationship in such a manner that the jig is to be disposed between the flexible printed circuit board and the heater head when the flexible printed circuit board is pressed and heated by the heater head. The jig includes a thin plate having a base plate and a wing plate. The base plate is parallel to a top surface of the heater head to be sandwiched between the flexible printed circuit board and the heater head. The wing plate is disposed on both sides of the base plate to be bent from the base plate.

The above equipment for bonding the circuit boards provides to bond the circuit boards without adding an additional process for sealing therebetween with resin and the like. Therefore, the manufacturing cost for bonding is reduced. Further, the equipment provides the bonded circuit boards without partially thin portion. Therefore, the bonded circuit boards have sufficient mechanical strength.

Preferably, a part of the flexible printed circuit board is to be pressed and heated by the heater head through the base plate so that the part is melted. Other part except for the part to be melted is not to be melted. The part to be melted is surrounded by the other part not to be melted, the printed circuit board and the base plate so that the thermoplastic resin composing the part to be melted does not flow out in a case where the part is melted.

Preferably, the printed circuit board is rigid. The thin plate is made of SUS stainless steel, and the jig further includes a heat sink made of copper. The wing plate is mounted on the heat sink so that heat of the wing plate is conducted to the heat sink. More preferably, the base plate does not directly contact the heat sink so that the thin plate has a temperature distribution in such a manner that temperature of the base plate is higher than that of the wing plate.

Preferably, the heater head is hollow. The heater head has a top end having a horizontal plate and a pair of vertical plates disposed on both sides of the horizontal plate, and the horizontal plate and the vertical plates have a thickness, which is thinner than other portions. More preferably, the top end of the heater head further includes a pair of connection portions disposed on upper ends of the vertical plates, respectively. The horizontal plate is parallel to the base plate. The vertical plate is perpendicular to the horizontal plate. The connection portions are protruded obliquely and upwardly from both upper ends of the vertical plates so that the connection portions separate away.

Further, a method for soldering and bonding a flexible printed circuit board on a printed circuit board is provided. The flexible printed circuit board is made of thermoplastic resin. The method includes the steps of: pressing the flexible printed circuit board on the printed circuit board by using a heater head through a jig; and heating the flexible printed circuit board by using the heater head through the jig. The jig prevents the thermoplastic resin composing the flexible printed circuit board from flowing out in a case where a part of the flexible printed circuit is melted by the heater head through the jig.

The above method for bonding the circuit boards provides to bond the circuit boards without adding an additional process for sealing therebetween with resin and the like.

Therefore, the manufacturing cost for bonding is reduced. Further, the method provides the bonded circuit boards without partially thin portion. Therefore, the bonded circuit boards have sufficient mechanical strength.

Preferably, the jig and the heater head have a predetermined positional relationship in such a manner that the jig is to be disposed between the flexible printed circuit board and the heater head in the step of pressing the flexible printed circuit board with the heater head. The jig includes a thin plate having a base plate and a wing plate. The base plate is parallel to a top surface of the heater head to be sandwiched between the flexible printed circuit board and the heater head. The wing plate is disposed on both sides of the base plate to be bent from the base plate. More preferably, the part of the flexible printed circuit board is pressed and heated by the heater head through the base plate so that the part is melted in the step of heating the flexible printed circuit board by using the heater head. Other part except for the melted part is not melted in the step of heating the flexible printed circuit board. The melted part is surrounded by the other non-melted part, the printed circuit board and the base plate so that the thermoplastic resin composing the melted part does not flow out in the step of heating the flexible printed circuit board.

Preferably, the method further includes the step of cooling the heater head and the melted part of the flexible printed circuit board after the step of heating the flexible printed circuit board.

Preferably, the method further includes the steps of: adhering the printed circuit board on an attachment table through an elastic sheet; and preliminarily heating the printed circuit board.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 12A:
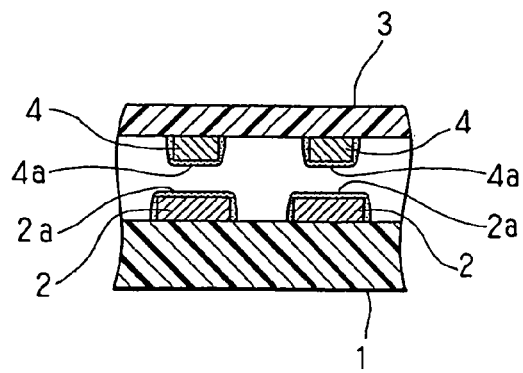
FIG. 12A is a cross sectional view showing a printed circuit board and a flexible printed circuit board.
Figure 12B:
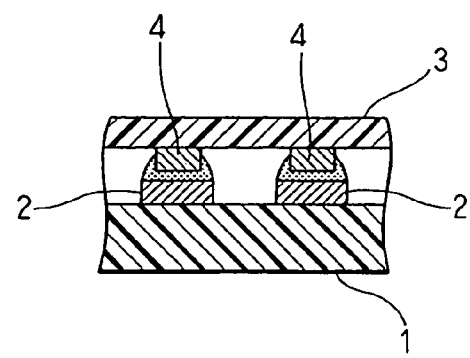
FIG. 12B is a cross sectional view showing the printed circuit board bonded to the flexible printed circuit board.
Figure 12C:
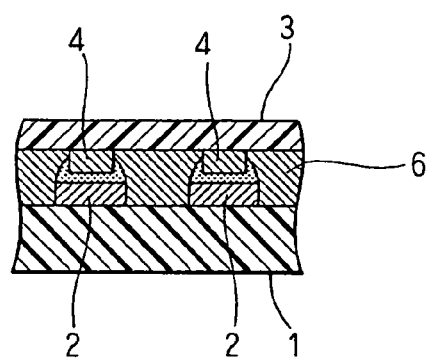
FIG. 12C is a cross sectional view showing the printed circuit board and the flexible printed circuit board filled with resin therebetween, according to a comparison method of the first embodiment.
Figure 13:
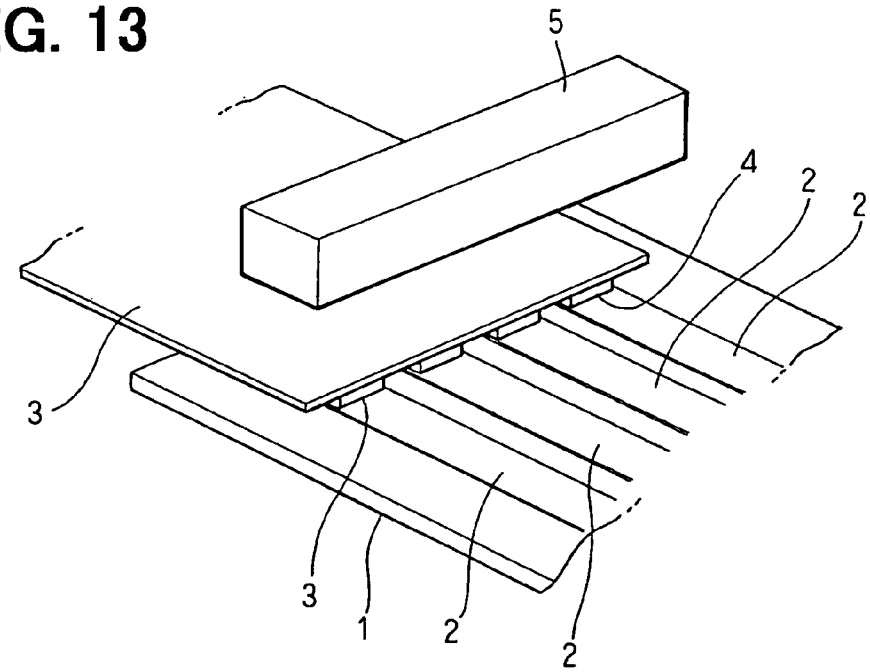
FIG. 13 is a perspective view explaining an operation of a heater head, according to the comparison method of the first embodiment.

The inventors preliminarily attempt a comparison method for bonding a flexible printed circuit board on a printed circuit board. As shown in FIGS. 12A–13, a lead terminal (i.e., a land) 2 of the printed circuit board 1 is soldered to a lead terminal (i.e., a land) 4 of the flexible printed circuit board 3. The lead terminal 2 of the printed circuit board 1 faces the lead terminal 4 of the flexible printed circuit board 3. Then, the flexible printed circuit board 3 is pressed and heated from the upper side of the flexible printed circuit board 3 by a heating tool (i.e., a heater head) 5 of hot press equipment shown in FIG. 13. Thus, a solder 2a of the lead terminal 2 and a solder 4a of the lead terminal 4 are melted, respectively, so that they 2, 4 are bonded together.

After soldering between the lead terminals 2, 4, a clearance is formed between the printed circuit board 1 and the flexible printed circuit board 3. The clearance is sealed and filled with resin 6. The resin 6 also works as reinforcement of a connection between the circuit boards 1, 3 and water protect of the lead terminals 2, 4.

However, in the above comparison method, it is necessitated to add an additional process for sealing and filling the clearance between the circuit boards 1, 3 with the resin 6 after the terminals 2, 4 are bonded and soldered. Therefore, the number of manufacturing processes in the comparison method is increased, so that a manufacturing cost is increased.

Figure 5:
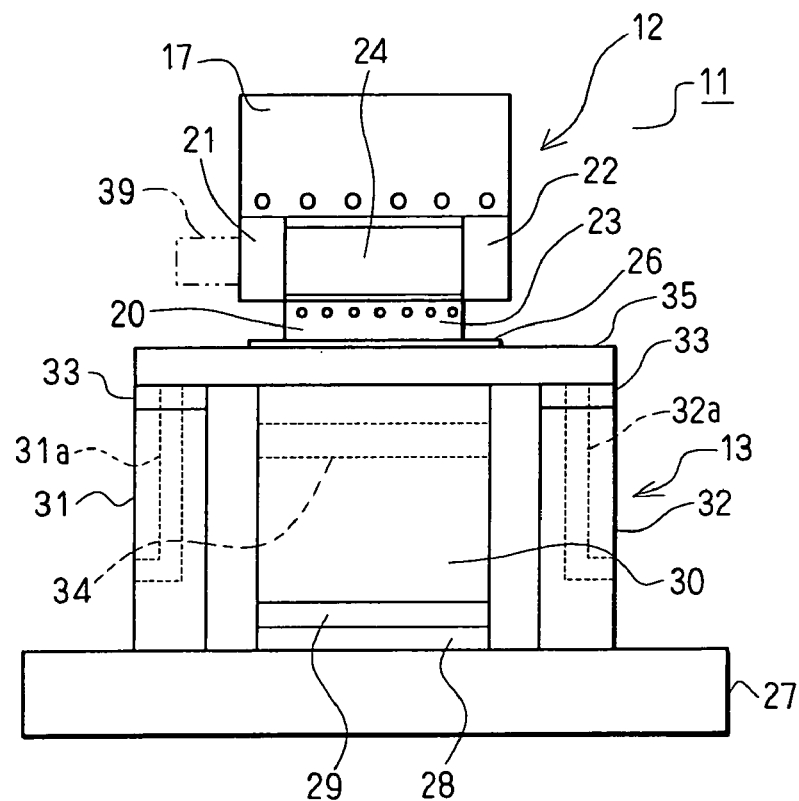
FIG. 5 is a front view showing equipment for bonding printed circuit boards, according to the first embodiment.

In view of the above problem, a method for bonding a printed circuit board to a flexible printed circuit board according to a first embodiment of the present invention is provided. FIG. 5 shows equipment 11 for bonding printed circuit boards. The equipment 11 works as a soldering equipment for soldering a lead terminal (i.e., a land) of the flexible printed circuit board on a lead terminal (i.e., a land) of the printed circuit board. Further, the equipment 11 works for bonding the circuit boards. Here, the printed circuit board has rigidity, i.e., the circuit board is rigid, and the flexible printed circuit board is made of thermoplastic resin so that the circuit board is flexible. The soldering equipment 11 includes a heating tool 12 and a mounting table 13.

As shown in FIGS. 1–4, the heating tool 12 includes a heater head 14. Both upper ends of the heater head 14 are mounted on a part of electrodes 17, 18 with screws 19, respectively. The heater head 14 is made of titanium alloy such as Ti-6Al-4V titanium alloy, which is hardly oxidized and has a large yield stress larger than that of normal titanium in a temperature range above 500° C. Here, dimensions of the heater head 14 shown in FIGS. 1A–1C is almost the same as the heater head 5 shown in FIG. 13.

The electrodes 17, 18 work for supplying electric power to the heater head 14 and for mounting the heater head 14 thereon. The electrodes 17, 18 are supported movably on a cylinder actuator and the like (not shown). The electrodes 17, 18 and the cylinder actuator have almost the same construction as those in a well-known art. Thus, the electrodes 17, 18 can move up and down in the vertical direction.

A jig 20 for limiting a resin flow is mounted on the electrodes 17, 18 through a pair of installation members 21, 22. The jig 20 is composed of a thin plate 23 and a heat sink 24. The thin plate 23 is made of stainless steel such as SUS stainless steel, and the heat sink 24 is made of copper. Specifically, the thin plate 23 is made of ferrite type SUS stainless steel (i.e., ferrite stainless steel), which has a coefficient of linear expansion being nearly equal to that of the titanium alloy. More specifically, the thin plate 23 is made of JIS-SUS 400 series stainless steel such as SUS403 stainless steel. Here, JIS-SUS 400 series stainless steels are defined in JIS handbook published by Japanese Standards Association. The thin plate 23 has a thickness of 50 μm. The thin plate 23 includes a base plate 23a and a pair of wing plates 23b, 23c. The wing plates 23b, 23c are disposed on both sides of the base plate 23a, respectively, and formed by bending a plate obtusely. The thin plate 23 has an almost V-shaped cross section.

Figure 3:
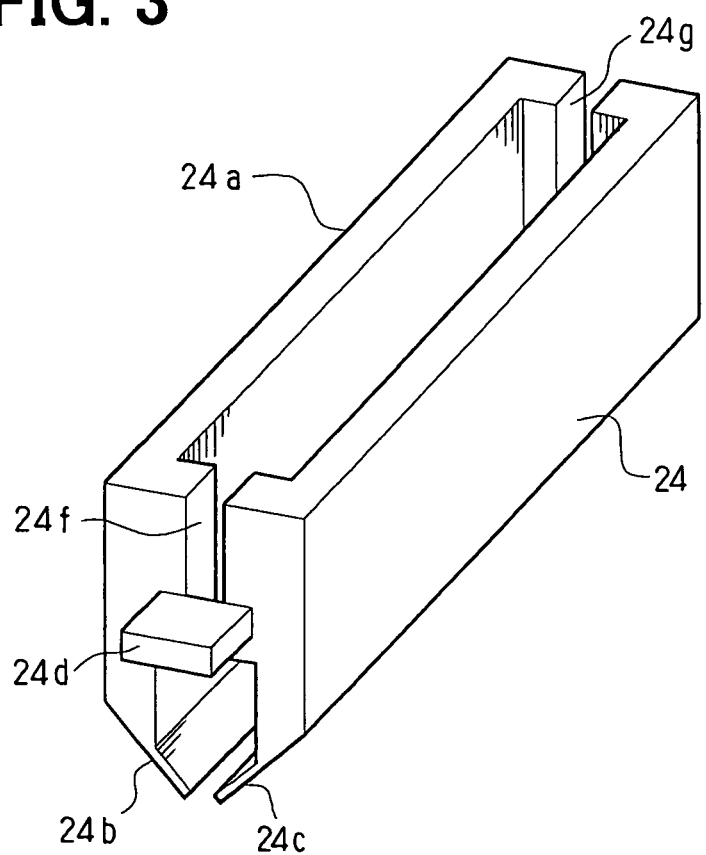
FIG. 3 is a perspective view showing a heat sink of the heating tool, according to the first embodiment.

As shown in FIG. 3, the heat sink 24 includes a frame 24a, a pair of protrusions 24b, 24c, a pair of convexities 24d, 24e, and a pair of notches 24f, 24g. The frame 24a is horizontally long and slim. The protrusions 24b, 24c are protruded obliquely and downwardly from both lower ends of the frame 24a so that the protrusions 24b, 24c approaches each other. Both lower ends of the frame 24a are disposed in a shorter direction (i.e., in a latitudinal direction). The convexities 24d, 24e having a rectangular shape are protruded from both sidewalls of the frame 24a, which is disposed in a longitudinal direction, respectively. The notches 24f, 24g are disposed near the convexities 24d, 24e, respectively. The heat sink 24 is formed by, for example, cutting a copper block.

When the thin plate 23 is mounted on the heat sink 24, each wing plate 23b, 23c of the thin plate 23 contacts and fits on the outer circumference of each protrusion 24b, 24c of the heat sink 24. Further, the thin plate 23 is fixed and mounted on the heat sink 24 with screws 25.

Figure 4:
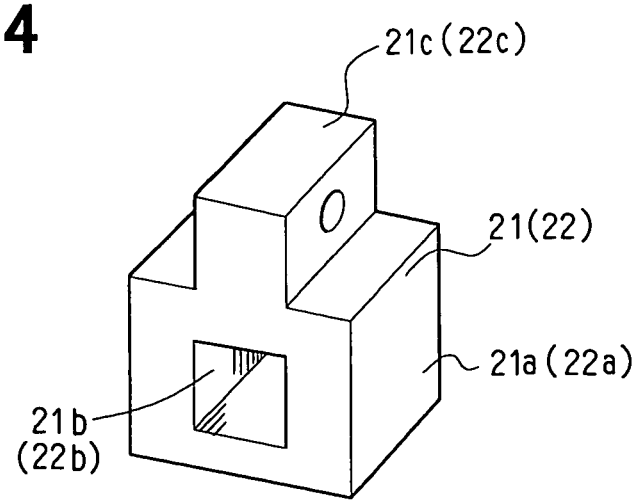
FIG. 4 is a perspective view showing an installation member, according to the first embodiment.

Both installation members 21, 22 are made of resin insulation material such as delrin (i.e., polyacetal homopolymer), PEEK (i.e., poly ether ether ketone), teflon, LCP (i.e., liquid crystal polymer) and the like. The installation members 21, 22 have the same construction. As shown in FIG. 4, the installation member 21 includes a block 21a, a through hole 21b, and a convexity 21c. The block 21a has a rectangular shape. The through hole 21b is disposed in a center portion of the block 21a, and has a rectangular shape. The convexity 21c protrudes from the top surface of the block 21a. The installation member 22 also includes a block 22a, a through hole 22b and a convexity 22c.

The convexities 24d, 24e of the heat sink 24 are inserted into the through holes 21b, 22b of the installation member 21, 22, respectively, so that the heat sink 24 is movably mounted on the installation member 21. Specifically, the heat sink 24 is movable in the vertical direction, which is perpendicular to the base plate 23a. In a case where the installation members 21, 22 are mounted on the electrodes 17, 18, respectively, the convexities 21c, 22c of the installation members 21, 22 are inserted between the electrodes 17, 18, as shown in FIG. 1C. Then, the installation members 21, 22 are fixed and mounted on the electrodes 17, 18 with the screws 19. Thus, the jig 20 is fixed to the electrodes 17, 18 through the installation members 21, 22.

Figure 1A:
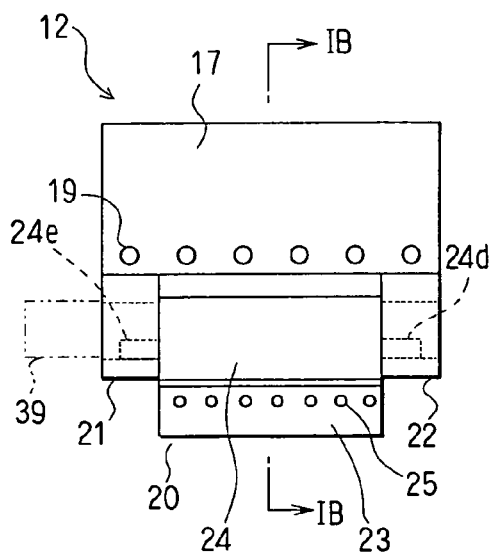
FIG. 1A is a front view showing a heating tool.
Figure 1B:
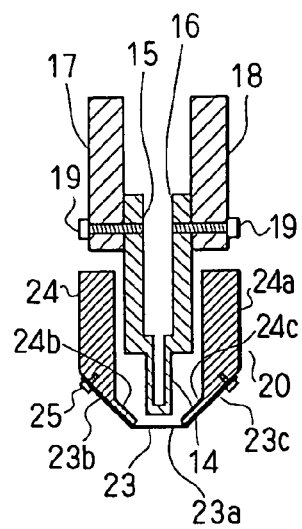
FIG. 1B is a cross sectional view showing the heating tool taken along line IB—IB in FIG. 1A.
Figure 1C:
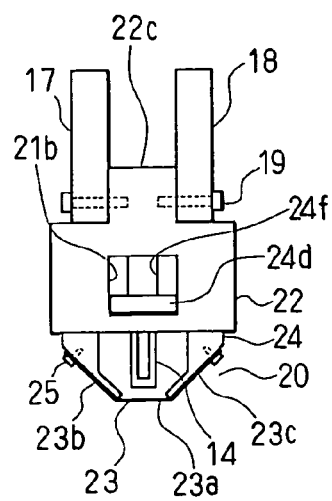
FIG. 1C is a side view showing the heating tool, according to a first embodiment of the present invention.

When the heater head 14 is disposed in an upper position, a clearance is formed between the top end of the heater head 14 and the thin plate 23 of the jig 20, as shown in FIGS. 1A–1C. On the other hand, the heater head 14 moves down so that the heater head 14 is disposed in a lower position. At that time, the heater head 14 presses a flexible printed circuit board 26. In this case, the clearance between the top end of the heater head 14 and the thin plate 23 of the jig 20 is disappeared, i.e., the top end of the heater head 14 contacts the thin plate 23 of the jig 20.

Figure 6:
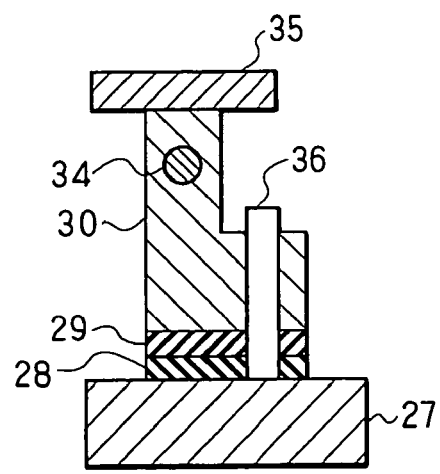
FIG. 6 is a cross sectional view showing a mounting table of the equipment according to the first embodiment.

As shown in FIGS. 5 and 6, the mounting table 13 includes a base 27, a heating stage 30, and a pair of attachment tables 31, 32. The heating stage 30 is fixed and mounted on the base 27 through an elastic sheet 28 and a heat insulation sheet 29. The attachment tables 31, 32 are disposed in a standing manner on both sides of the heating stage 30. Another elastic sheet 33 made of elastic material is mounted on a top of each attachment table 31, 32. The top of the heating stage 30 is disposed almost the same height as the tops of the attachment tables 31, 32.

The base 27 is movable in a horizontal direction by using X-Y moving equipment (not shown). Specifically, the base 27 moves in a X-direction and a Y-direction independently. The heating stage 30 is made of, for example, aluminum based material. Further, the heating stage 30 includes a heater 34 for preliminarily heating a printed circuit board 35 disposed thereon. The heating stage 30 is movably supported on the base 27 through multiple pins 36, as shown in FIG. 6. The multiple pins 36 are made of heat insulation material. The heating stage 30 is movable in the vertical direction. Specifically, the pins 36 are made of insulation material such as ceramics, bakelite, LCP, teflon and the like.

The attachment tables 31, 32 include air passages 31a, 32a for sucking the air (i.e., drawing in vacuum), respectively. A vacuum pump (not shown) as a sucking means sucks and pumps the air in the air passages 31a, 32a so that the printed circuit board 35 disposed on the attachment tables 31, 32 through the elastic sheet 33 is adhered to the attachment tables 31, 32.

The elastic sheet 28 is made of elastic material such as silicon film, and formed from a sheet. The heat insulation sheet 29 is made of, for example, heat insulation material having heat resistance and rigidity such as glass fiber reinforced teflon. The heat insulation sheet 29 is formed from a sheet. The elastic sheet 33 is made of elastic material such as silicon film, and formed from a sheet.

Next, the operation of the soldering equipment 11 is described as follows with reference to FIGS. 7 and 8. At first, the printed circuit board 35 is mounted on the heating stage 30 and the attachment tables 31, 32. Then, the vacuum pump (not shown) sucks the air in the air passages 31a, 32a of the attachment tables 31, 32. Thus, the printed circuit board 35 is adhered and fixed on the elastic sheet 33 of the attachment tables 31, 32. Then, the heater 34 of the heating stage 30 for heating the printed circuit board 35 is energized so that the printed circuit board 35 disposed on the heating stage 30 is preliminarily heated.

The printed circuit board 35 is directly mounted on the top surface of the heating stage 30. Therefore, the printed circuit board 35 is preliminarily heated strongly. Further, the heat insulation sheet 29 is disposed between the heating stage 30 and the base 27. Therefore, heat from the heating stage 30 does not conduct the base 27. Furthermore, the elastic sheet 28 is disposed between the heating stage 30 and the base 27, and the other elastic sheet 33 is disposed on the top surface of the attachment tables 31, 32. Therefore, even if the thickness of the printed circuit board 35 is deviated (i.e., even if the printed circuit board 35 has a thick portion and a thin portion), the influence of the deviation of the thickness is suppressed (i.e., absorbed or relaxed) by displacing the heating stage 30 freely along with the pin 36 in the vertical direction.

Successively, a flexible printed circuit board 26 is placed and temporary mounted on the printed circuit board 35 so as to put the land of the flexible printed circuit board 26 on the land of the printed circuit board 35. Here, each land works as a lead terminal for soldering. Then, the heater head 14 is dropped down (i.e., moved down) so that the heater head 14 presses the flexible printed circuit board 26. Thus, the flexible printed circuit board 26 is heated with the heater head 14. The temperature of the heater head 14 is set to be higher than an ordinary temperature of a hot press method. Specifically, the temperature of the heater head is, for example, in a range between 450° C. and 600° C.

In this embodiment, the thin plate 23 of the jig 20 is disposed between the flexible printed circuit board 26 and the heater head 14. Therefore, the resin composing the flexible printed circuit board 26 is limited from flowing out so that the thickness of the flexible printed circuit board 26 is prevented from thinning excessively. This limitation of the resin outflow is described as follows. Here, the thermoplastic resin composing the flexible printed circuit board 26 is, for example, LCP, and its melting temperature (i.e., a liquid crystal transition temperature) is, for example, 335° C.

In general, SUS stainless steel has low heat conductivity, which is lower than that of normal metal. Further, the wing plates 23b, 23c disposed on both ends of the thin plate 23 made of SUS stainless steel are connected to the protrusions 24b, 24c of the heat sink 24 made of copper, respectively. Therefore, the thin plate 23 has a temperature distribution. Specifically, as shown in FIG. 7, the temperature of a portion P of the thin plate 23, on which the heater head 14 is to contact, is increased up to 336° C. On the other hand, the temperature of a portion Q of the thin plate 23, on which the heater head 14 is not to contact, is only increased up to 318° C. Specifically, the portion Q except for the portion P has a maximum temperature of 318° C. In this case, heat of the portion Q of the thin plate 23 is conducted (i.e., radiated) to the frame 24a of the heater head 24 through the protrusion 24b, 24c of the heater head 24.

Since the thin plate 23 has the above temperature distribution, a part of the resin composing the flexible printed circuit board 26, which is pressed with the portion P of the thin plate 23, is melt. However, the other part of the resin composing the flexible printed circuit board 26, which is pressed with the portion Q of the thin plate 23, is not melted. At this time, the melted resin is surrounded by the non-melted resin corresponding to the portion Q and the thin plate 23, so that the melted resin does not flow out. Accordingly, the thickness of the flexible printed circuit board 26, specifically, the thickness of the flexible printed circuit board 26 corresponding to the portion P becomes sufficiently thick.

Figure 7:
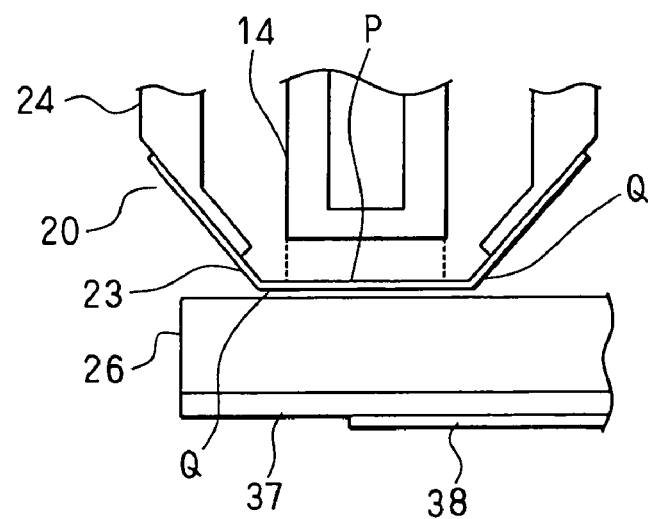
FIG. 7 is a schematic side view explaining an operation of the installation member, according to the first embodiment.

In FIG. 7, a copper land 37 is disposed on the bottom of the flexible printed circuit board 26, and a solder resist 38 is also disposed on the bottom of the flexible printed circuit board 26 through the copper land 37. A part of the copper land 37, on which the solder resist 38 is not disposed, is covered with a solder coating or a solder paste (not shown).

Figure 8:
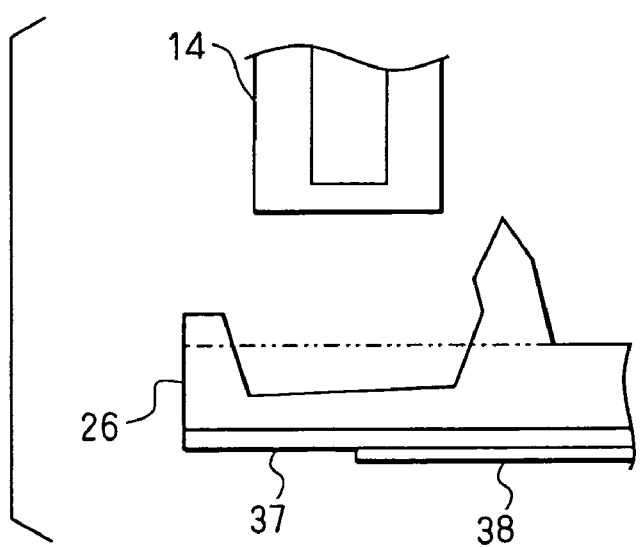
FIG. 8 is a schematic side view explaining a resin flow in a case where the installation member is not used, according to the first embodiment.

FIG. 8 explains a deformation of the resin composing the flexible printed circuit board 26 in a case where the jig 20 is not used. As shown in FIG. 8, a part of the flexible printed circuit board 26 is much thinned, the part being pressed with the heater head 14. Further, the resin composing the flexible printed circuit board 26 disposed around the part corresponding to the heater head 14 rises up, so that the risen part of the flexible printed circuit board 26 is formed, as shown in FIG. 8. Therefore, when the flexible printed circuit board 26 is bent, a stress is concentrated at the part of the flexible printed circuit board 26. Therefore, the land of the circuit boards 26, 35 may be broken so that a circuit is shorted. Further, the flexible printed circuit board 26 may be damaged or broken. However, by using the jig 20, the flexible printed circuit board 26 is bonded to the printed circuit board 35 without any thin portion of the flexible printed circuit board 26 substantially. Thus, the method of this embodiment with using the jig 20 can solve the above problem.

Figure 2A:
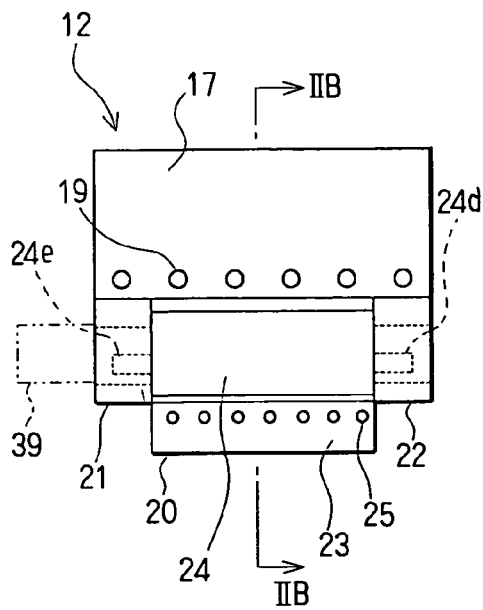
FIG. 2A is a front view showing the heating tool in case of a down position.
Figure 2B:
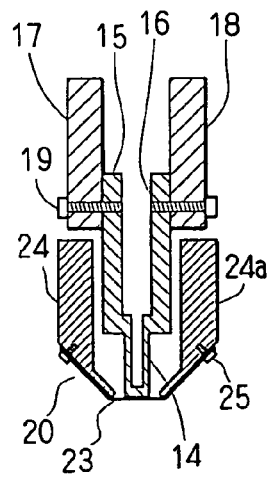
FIG. 2B is a cross sectional view showing the heating tool taken along line IIB—IIB in FIG. 2A.
Figure 2C:
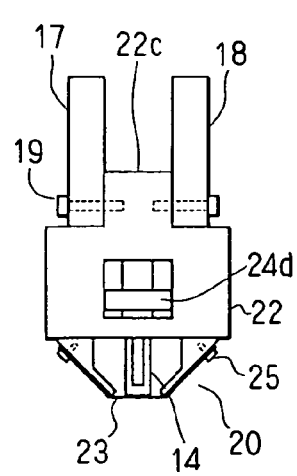
FIG. 2C is a side view showing the heating tool in case of the down position, according to the first embodiment.

Thus, the heater head 14 presses and heats the flexible printed circuit board 26 so that a solder on the land of both of the circuit boards 26, 35 are melted and bonded together and that the resin composing the flexible printed circuit board 26 is melted for bonding the circuit boards 26, 35. After that, the heater head 14 is required to be cooled before elevating up the heater head 14 until the solder on the land is solidified. For example, the solder is solidified at 183° C. As shown in FIGS. 1A and 2A, a nozzle 39 of a pipe (not shown) for supplying a cooling air is connected and inserted into the notch 24f of the heat sink 24 and the through hole 21b of the installation member 21 disposed on the left side of the heating tool 12, or the nozzle 39 is mounted to face and to approach the notch 24f and the through hole 21b. Thus, the cooling air is supplied by an air compressor or an air blower (not shown) through the nozzle 39 of the pipe. Specifically, the cooling air is supplied to the inside of the heater head 14 and its periphery through the through hole 21b of the installation member 21 and the notch 24f of the heat sink 24. Thus, the heater head 14 is cooled rapidly and sufficiently. Further, even after the heater head 14 is elevated from a soldering portion of the flexible printed circuit board 26, the heater head 14 is cooled.

In this embodiment, the flexible printed circuit board 26 is made of thermoplastic resin. Further, when the flexible printed circuit board 26 is pressed and heated with the heater head 14, the jig 20 is used between the flexible printed circuit board 26 and the heater head 14 so that the jig 20 prevents the resin composing the flexible printed circuit board 26 from flowing out. The jig 20 includes a base plate 23a to be sandwiched between the flexible printed circuit board 26 and the heater head 14, the thin plate 23 made of SUS stainless steel, and a pair of protrusions 24b, 24c. Here, the thin plate 23 has a pair of wing plates 23b, 23c disposed on both ends of the base plate 23a. Further, the jig 20 includes the heat sink 24 made of copper and mounted on the heater head 14. By using the jig 20, the thermoplastic resin composing the flexible printed circuit board 26 is melt by heat of soldering the land, so that the melted thermoplastic resin fills in the clearance between the circuit boards 26, 35. Thus, the method according to this embodiment can omit a process for sealing and filling in the clearance with resin, so that the number of processes for bonding the circuit boards 26, 35 is reduced. Thus, the manufacturing cost for bonding the circuit boards is reduced.

Specifically, when the flexible printed circuit board 26 is pressed and heated by the heater head 14, the jig 20 is used between the flexible printed circuit board 26 and the heater head 14 so that the jig 20 prevents the resin composing the flexible printed circuit board 26 from flowing out. Therefore, the melted resin is prevented from flowing out when the flexible printed circuit board 26 is heated. Thus, when the melted resin is cooled and solidified, the thickness of the flexible printed circuit board 26 is prevented from thinning.

Further, when the jig 20 for preventing the resin from flowing out is inserted into the heating tool 12, the heater head 14 is energized, and the installation members 21, 22 made of insulation material and having the through holes 21a, 22a is fixed to the electrodes 17, 18 for fixing the heater heat 14 thereon with screws. The installation members 21, 22 are separated from the electrodes 17, 18 at a predetermined distance, respectively. Thus, the jig 20 is installed between the installation members 21, 22. At that time, the convexities 24d, 24e protruded from the heat sink 24 of the jig 20 is inserted into the through holes 21a, 22a of the installation members 21, 22, respectively, so that the jig 20 is movably supported on the installation members 21, 22. The jig 20 is movable in the vertical direction, i.e., in the direction perpendicular to the base plate 23a. In this arrangement, the jig 20 is mounted near the heater head easily and simply. Further, an allowance in the vertical direction is prepared between the jig 20 and the installation members 21, 22 (i.e., the heater head 14), so that the flexible printed circuit board 26 is pressed uniformly when the flexible printed circuit board 26 is pressurized with the heater head through the jig 20.

Furthermore, the cooling air is sufficiently supplied to the jig 20 and the inside of the heater head 14 through the notch 24f disposed around the convexity 24d of the heat sink 24 of the jig 20, so that the heater head 14 and the soldering portion are cooled rapidly.

Further, the printed circuit board 35 is preliminarily heated, and the soldering equipment 11 includes the heating stage 30 mounted on the base 27 through the heat insulation sheet 29 and the elastic sheet 28. The printed circuit board 35 is mounted and adhered on the attachment tables 31, 32 through the elastic sheet 33. Therefore, the elastic sheets 28, 33 works as a cushion of the printed circuit board 35 so that the printed circuit board 35 is capable of sinking. Thus, the heating stage 30 is freely elevated up and down by the pin 36, so that the deviation of the thickness of the printed circuit board 35 is sufficiently absorbed (i.e., relaxed).

Further, the heater head 14 is made of titanium alloy, so that the heater head 14 has a long lifetime. The thin plate 23 of the jig 20 is made of JIS-SUS 400 series stainless steel such as SUS 430 stainless steel, so that the coefficient of linear expansion of the heater head 14 approaches the coefficient of linear expansion of the thin plate 23. Accordingly, the thermal stress is reduced as much as possible. The thermal stress is generated by the difference of the coefficient of linear expansions between the heater head 14 and the thin plate 23.

Thus, the method and the equipment 11 for bonding the circuit boards 26, 35 provide to bond the circuit boards 26, 35 without adding an additional process for sealing therebetween 26, 35 with resin and the like. Therefore, the manufacturing cost for bonding is reduced. Further, the method and the equipment 11 provide the bonded circuit boards 26, 35 without partially thin portion. Therefore, the bonded circuit boards 26, 35 have sufficient mechanical strength.

Second Embodiment

Figure 9:
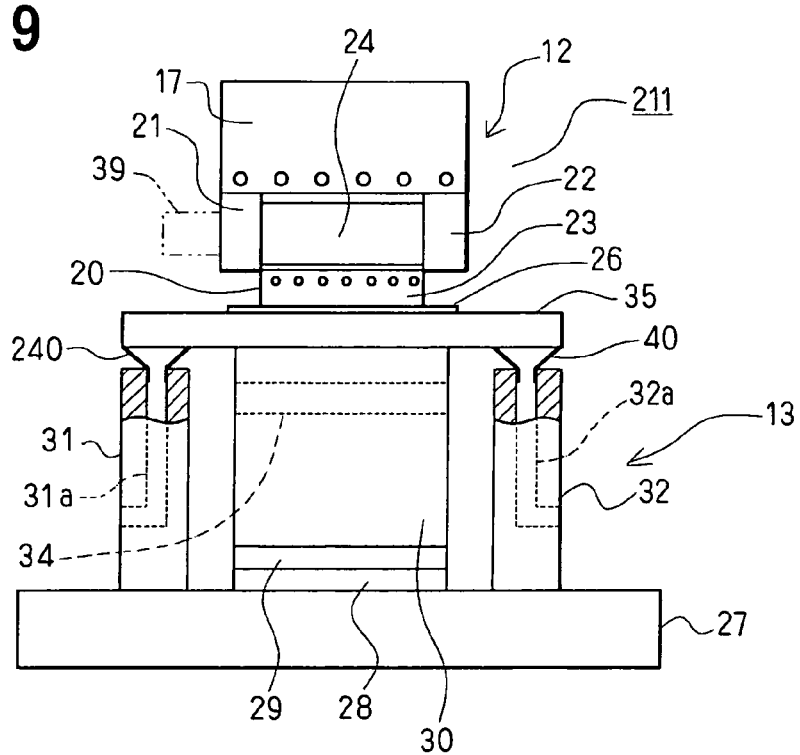
FIG. 9 is a front view showing equipment for bonding printed circuit boards, according to a second embodiment of the present invention.

FIG. 9 shows soldering equipment 211 for bonding printed circuit boards 26, 35, according to a second embodiment of the present invention. An attachment nozzle 240 made of elastic material is formed on the top surface of the attachment table 31, 32. Specifically, the equipment 211 shown in FIG. 9 includes the attachment nozzle 240 instead of the elastic sheet 33 of the equipment 11 shown in FIG. 5. The attachment nozzle 240 has almost the same construction as a component used in a chip attachment device in a chip mounting equipment or used in a vacuum tweezers.

The method and the equipment 211 for bonding the circuit boards 26, 35 provide to bond the circuit boards 26, 35 without adding an additional process for sealing therebetween 26, 35 with resin and the like. Therefore, the manufacturing cost for bonding is reduced. Further, the method and the equipment 211 provide the bonded circuit boards 26, 35 without partially thin portion. Therefore, the bonded circuit boards 26, 35 have sufficient mechanical strength.

Third Embodiment

Figure 10:
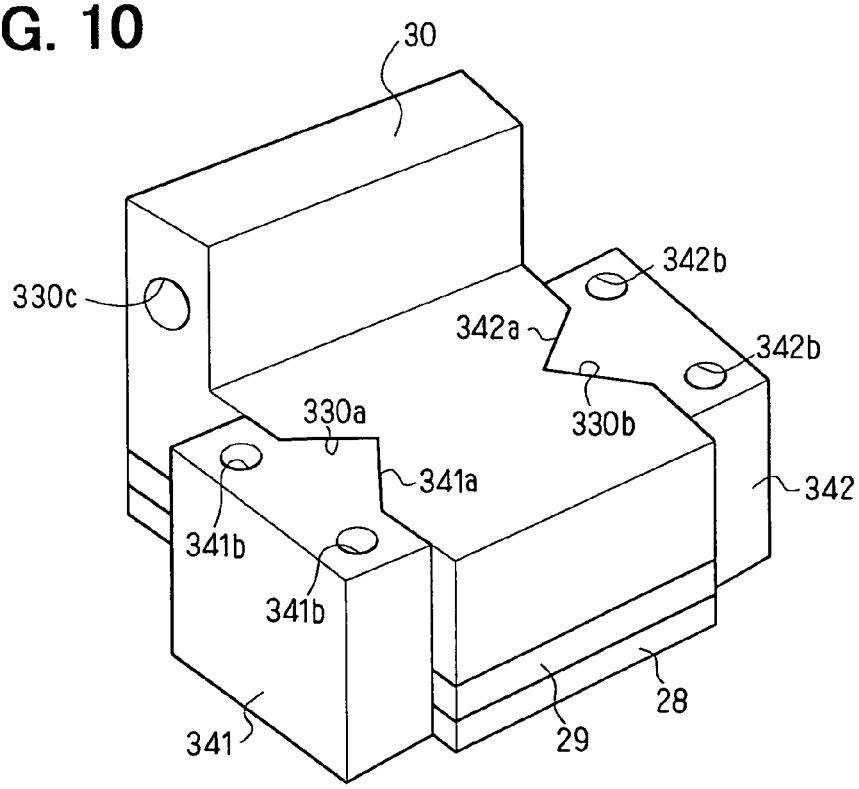
FIG. 10 is a perspective view showing a heating stage with a support member, according to a third embodiment of the present invention.

FIG. 10 shows the heating stage 30 of soldering equipment for bonding printed circuit boards 26, 35, according to a third embodiment of the present invention. The heating stage 30 is movably supported on a pair of support members 341, 342 instead of the pin 36 shown in FIG. 5.

Specifically, the support members 341, 342 face each other at a predetermined distance and fixed on the base 27 with a screw. A pair of convexities 341a, 342a having a triangle cross section are disposed on the side surface of the support members 341, 342, respectively. The convexities 341a, 342a extend in the vertical direction. A pair of grooves 330a, 330b having a triangle cross section is disposed on both sides of the heating stage 30. The grooves 330a, 330b extend in the vertical direction. Each convexity 341a, 342a of the support members 341, 342 is movably engaged to the groove 330a, 330b. Thus, the heating stage 30 is supported movably in the vertical direction.

The heating stage 30 is made of aluminum. A hole 330c for accommodating the heater 34 is formed in the heating stage 30. The support member 341, 342 is made of insulation material such as ceramics, bakelite, LCP, teflon and the like. A hole 341b, 342b for screwing the support member 341, 342 on the base 27 is formed in the support member 341, 342.

The method and the equipment according to the third embodiment provide to bond the circuit boards 26, 35 without adding an additional process for sealing therebetween 26, 35 with resin and the like. Therefore, the manufacturing cost for bonding is reduced. Further, the method and the equipment provide the bonded circuit boards 26, 35 without partially thin portion. Therefore, the bonded circuit boards 26, 35 have sufficient mechanical strength.

Fourth Embodiment

Figure 11A:
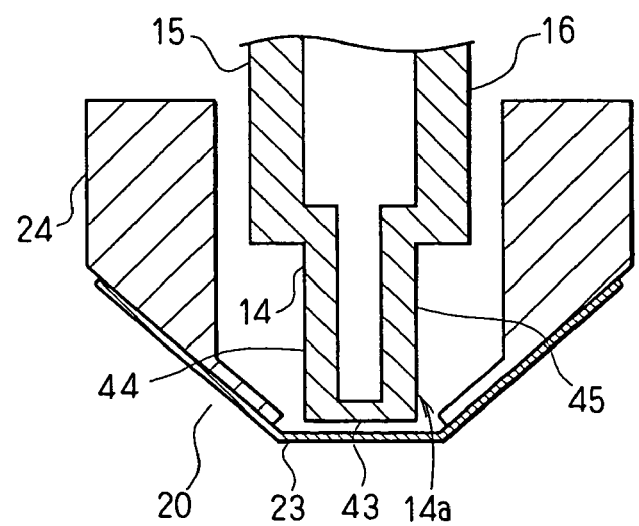
FIG. 11A is a partially enlarged cross sectional view showing a top end of a heater head of the heating tool shown in FIG. 1B.
Figure 11B:
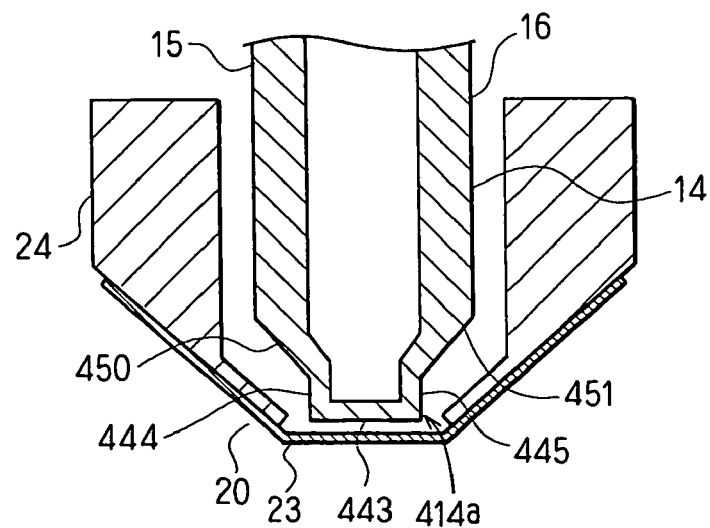
FIG. 11B is a partially enlarged cross sectional view showing a top end of a heater head of the heating tool in equipment according to a fourth embodiment of the present invention.

FIG. 11B shows the heater head 14 of soldering equipment for bonding printed circuit boards 26, 35, according to a fourth embodiment of the present invention. The heater head 14 has a top end 414a, which is different from the top end 14a of the heater head 14 shown in FIG. 11A.

As shown in FIG. 11A, the top end 14a of the heater head 14 includes a bottom plate 43 and a pair of sidewalls 45, 46. The bottom plate 43 is disposed horizontally, and the sidewalls 45, 46 are disposed vertically so that the sidewalls 45, 46 are perpendicular to the bottom plate 43. The sidewalls 45, 46 are disposed on both sides of the bottom plate 43, and extend upwardly. The thickness of the bottom plate 43 in the vertical direction is in a range between 0.6 mm and 1.0 mm. That is, the bottom plate 43 is thinned as long as the heater head 14 generates heat. The thickness of the bottom plate 43 is thinner than that of the sidewalls 44, 45. Thus, when the heater head 14 is energized, mainly the bottom plate 43 generates heat.

On the other hand, as shown in FIG. 11B, the heater head 14 of the equipment according to the fourth embodiment includes a bottom plate 443, a pair of sidewalls 444, 445, and a pair of connection portions 450, 451. The bottom plate 443 is disposed horizontally, and the sidewalls 444, 445 are disposed vertically so that the sidewalls 444, 445 are perpendicular to the bottom plate 443. The sidewalls 444, 445 are disposed on both sides of the bottom plate 443, and extend upwardly. The connection portions 450, 451 connect between the top ends of the sidewalls 444, 445 and the lower ends of the upper portions 15, 16 of the heater head 14, respectively. The thickness of the bottom plate 443 in the vertical direction is in a range between 0.6 mm and 10 mm. Also the thickness of the sidewalls 444, 445 in the horizon direction is in a range between 0.6 mm and 10 mm. That is, the bottom plate 443 and the sidewalls 444, 445 are thinned as long as the heater head 14 generates heat. The thickness of the connection portions 450, 451 are increased gradually as it goes upwardly.

Thus, when the heater head 14 is energized, the bottom plate 443 and the sidewalls 444, 445 generate heat, and in addition, the connection portions 450, 451 also generate heat. Here, the length of the bottom plate 443 in the horizontal direction in FIG. 11B is equal to that of the bottom plate 43 in FIG. 11A. The distance between the upper portions 15, 16 of the heater head 14 in FIG. 11B is equal to that in FIG. 11A. The thickness of the upper portion 15, 16 of the heater head 14 in FIG. 11B is equal to that in FIG. 11A. Specifically, the thickness of the upper portion 15, 16 in the horizontal direction is, for example, in a range between 2 mm and 5 mm.

In the fourth embodiment, the thickness of each of the bottom plate 443 and the sidewalls 444, 445 is thinned, and the thickness of the connection portion 450, 451 becomes thicker as it goes from the lower portion to the upper portion of the connection portion 450, 451. Therefore, the bottom plate 443, the sidewalls 444, 445, and the connection portions 450, 451 generate heat. Therefore, the top end 414a of the heater head 14 has a large heat generation area, which is larger than the heat generation area of the top end 14a of the heater head 14 shown in FIG. 11A. Although the jig 20 radiates heat, the soldering portion is sufficiently heated.

The method and the equipment according to the fourth embodiment provide to bond the circuit boards 26, 35 without adding an additional process for sealing therebetween 26, 35 with resin and the like. Therefore, the manufacturing cost for bonding is reduced. Further, the method and the equipment provide the bonded circuit boards 26, 35 without partially thin portion. Therefore, the bonded circuit boards 26, 35 have sufficient mechanical strength.

Such changes and modifications are to be understood as being within the scope of the present invention as defined by the appended claims.

What is claimed is:

1. Equipment for soldering and bonding a flexible printed circuit board on a printed circuit board, wherein the flexible printed circuit board is made of thermoplastic resin, the equipment comprising:

a heater head for pressing and heating the flexible printed circuit board on the printed circuit board;

a jig for preventing the thermoplastic resin composing the flexible printed circuit board from flowing out in a case where the flexible printed circuit is heated by the heater head; and an electrode for supplying electricity to the heater head, wherein the jig and the heater head have a predetermined positional relationship in such a manner that the jig is to be disposed between the flexible printed circuit board and the heater head when the flexible printed circuit board is pressed and heated by the heater head, wherein the jig includes a thin plate having a base plate and a wing plate, wherein the base plate is parallel to a top surface of the heater head to be sandwiched between the flexible printed circuit board and the heater head, wherein the wing plate is disposed on both sides of the base plate to be bent from the base plate, wherein the printed circuit board is rigid, wherein the thin plate is made of SUS stainless steel, wherein the jig further includes a heat sink made of copper, wherein the wing plate is mounted on the heat sink so that heat of the wing plate is conducted to the heat sink, wherein the heater head is mounted on the electrode, and wherein the jig is movably supported by the electrode through an installation member so that the jig is movable in a direction perpendicular to the base plate.

2. The equipment according to claim 1, wherein the heat sink is cooled by an air supplied from an outside fan.

3. The equipment according to claim 2, wherein the heat sink includes a notch, wherein the installation member is made of insulation material, and includes a through hole, and wherein the air is introduced to the heat sink through the notch and the through hole.

4. Equipment for soldering and bonding a flexible printed circuit board on a printed circuit board, wherein the flexible printed circuit board is made of thermoplastic resin, the equipment comprising:

a heater head for pressing and heating the flexible printed circuit board on the printed circuit board;

a jig for preventing the thermoplastic resin composing the flexible printed circuit board from flowing out in a case where the flexible printed circuit is heated by the heater head; and a heating stage for preliminarily heating the printed circuit board and for mounting the printed circuit board, wherein the heating stage includes a base and an attachment table disposed on the base, wherein the printed circuit board is mounted on and adhered to the attachment tables, wherein the jig and the heater head have a predetermined positional relationship in such a manner that the jig is to be disposed between the flexible printed circuit board and the heater head when the flexible printed circuit board is pressed and heated by the heater head, wherein the jig includes a thin plate having a base plate and a wing plate, wherein the base plate is parallel to a top surface of the heater head to be sandwiched between the flexible printed circuit board and the heater head, and wherein the wing plate is disposed on both sides of the base plate to be bent from the base plate.

5. Equipment for soldering and bonding a flexible printed circuit board on a printed circuit board, wherein the flexible printed circuit board is made of thermoplastic resin, the equipment comprising:
- a heater head for pressing and heating the flexible printed circuit board on the printed circuit board; and
- a jig for preventing the thermoplastic resin composing the flexible printed circuit board from flowing out in a case where the flexible printed circuit is heated by the heater head,
- wherein the jig and the heater head have a predetermined positional relationship in such a manner that the jig is to be disposed between the flexible printed circuit board and the heater head when the flexible printed circuit board is pressed and heated by the heater head,
- wherein the jig includes a thin plate having a base plate and a wing plate,
- wherein the base plate is parallel to a top surface of the heater head to be sandwiched between the flexible printed circuit board and the heater head,
- wherein the wing plate is disposed on both sides of the base plate to be bent from the base plate,
- wherein the heater head is hollow,
- wherein the heater head has a top end having a horizontal plate and a pair of vertical plates disposed on both sides of the horizontal plate,
- wherein the horizontal plate and the vertical plates have a thickness, which is thinner than other portions,
- wherein the top end of the heater head further includes a pair of connection portions disposed on upper ends of the vertical plates, respectively,
- wherein the horizontal plate is parallel to the base plate,
- wherein the vertical plate is perpendicular to the horizontal plate, and
- wherein the connection portions are protruded obliquely and upwardly from both upper ends of the vertical plates so that the connection portions separate away.

6. The equipment according to claim 5,
- wherein the horizontal plate, the vertical plates and the connection portions are capable of generating heat.

* * * * *